United States Patent
Nakamura et al.

(10) Patent No.: US 7,839,159 B2
(45) Date of Patent: Nov. 23, 2010

(54) ZQ CALIBRATION CIRCUIT AND A SEMICONDUCTOR DEVICE INCLUDING A ZQ CALIBRATION CIRCUIT

(75) Inventors: Masayuki Nakamura, Tokyo (JP); Hideyuki Yoko, Kodaira (JP)

(73) Assignee: Elpida Memory, Inc., Tokyo (JP)

( * ) Notice: Subject to any disclaimer, the term of this patent is extended or adjusted under 35 U.S.C. 154(b) by 919 days.

(21) Appl. No.: 11/585,108

(22) Filed: Oct. 24, 2006

(65) Prior Publication Data
US 2007/0148796 A1 Jun. 28, 2007

(30) Foreign Application Priority Data
Oct. 25, 2005 (JP) ............... 2005-309416

(51) Int. Cl.
*G01R 31/26* (2006.01)
(52) U.S. Cl. .................... 324/765; 324/158.1
(58) Field of Classification Search .......... None
See application file for complete search history.

(56) References Cited

U.S. PATENT DOCUMENTS

| | | | |
|---|---|---|---|
| 5,606,275 A * | 2/1997 | Farhang et al. | 327/108 |
| 5,666,078 A * | 9/1997 | Lamphier et al. | 327/108 |
| 6,380,758 B1 | 4/2002 | Hsu et al. | |
| 6,573,746 B2 * | 6/2003 | Kim et al. | 326/30 |
| 2008/0054937 A1 * | 3/2008 | Kinoshita et al. | 326/30 |
| 2008/0122450 A1 * | 5/2008 | Yokou | 324/601 |

FOREIGN PATENT DOCUMENTS

| | | | |
|---|---|---|---|
| JP | 07142985 A | 6/1995 |
| JP | 8-335871 A | 12/1996 |
| JP | 100320074 A | 12/1998 |
| JP | 11027132 A | 1/1999 |
| JP | 2000243080 A | 9/2000 |
| JP | 2001094409 A | 4/2001 |
| JP | 2002-26712 A | 1/2002 |
| JP | 2004032070 A | 1/2004 |
| JP | 2005026890 A | 1/2005 |
| JP | 2005-65249 A | 3/2005 |
| JP | 2005-506647 A | 3/2005 |
| JP | 2006203405 A | 8/2006 |

* cited by examiner

*Primary Examiner*—Vinh P Nguyen
(74) *Attorney, Agent, or Firm*—Sughrue Mion, PLLC

(57) ABSTRACT

A ZQ calibration command is internally generated from an external command different from a ZQ calibration command so as to automatically perform an additional ZQ calibration operation. A command interval between an inputted command and a next command is effectively employed to obtain a ZQ calibration period. The external command different from the ZQ calibration command is preferably a self-refreshed command. The addition of the ZQ calibration operation shortens intervals between ZQ calibration operations. Thus, it is possible to obtain a ZQ calibration circuit capable of performing a ZQ calibration operation more accurately.

10 Claims, 3 Drawing Sheets

ZQ CALIBRATION CIRCUIT AND A SEMICONDUCTOR DEVICE INCLUDING A ZQ CALIBRATION CIRCUIT

This application claims priority to prior Japanese patent application JP 2005-309416, the disclosure of which is incorporated herein by reference.

BACKGROUND OF THE INVENTION

1. Field of the Invention

The present invention relates to a semiconductor device, and more particularly to a ZQ calibration circuit for adjusting impedance of an output circuit and a semiconductor device having such a ZQ calibration circuit.

2. Description of the Related Art

The speed of recent electronic systems has been enhanced, and an extremely high data transfer rate has been achieved between semiconductor devices forming a system. In order to achieve such an ultrafast data transfer, the amplitude of data signals is reduced. Further, impedance of a transmission line between semiconductor devices and an output impedance of an output circuit of the semiconductor device are matched with each other. The matched impedance provides transmission without causing distortion to data signals having a small amplitude, thereby enhancing a data transfer rate. If the impedance of the transmission lines between the semiconductor devices and the output impedance of the semiconductor device are not matched with each other, then a data waveform is dulled during transmission so as to cause an overshoot or an undershoot, so that a high speed data transfer cannot be performed.

In order to match impedance of a transmission line and output impedance of an output circuit with each other, it is necessary to adjust the output impedance of the semiconductor device so as to match the impedance of the transmission line. Generally, a calibration circuit is used to adjust output impedance of a semiconductor device. For example, a ZQ pin is provided as a ZQ calibration terminal in a semiconductor device, and an external ZQ calibration command (ZQCS or ZQCL) is inputted into the ZQ pin. When the external ZQ calibration command (ZQCS or ZQCL) is inputted, a ZQ calibration operation is performed within a period defined by the command. During the ZQ calibration operation, the output circuit cannot be used. Accordingly, access to chips is prohibited, and a next command is not inputted. Thus, the period defined by the ZQ calibration command is for ZQ calibration. The ZQ calibration should be completed within this period.

The period for ZQ calibration is defined as follows:

ti $tZQ\text{init}=512*tCK$ $tZQCS=64*tCK$ $tZQ\text{oper}=256*tCK$

Here, tCK represents a cycle of a clock. These specifications are defined by the number of clocks. Specifically, in the AC specifications, a ZQ calibration period (tZQinit) for ZQ calibration performed during an initial stage after power is turned on is defined as tZQinit=512*tCK. Further, ZQ calibration periods for ZQ calibration performed after the initial stage are defined according to inputted commands. A ZQ calibration period (tZQCS) for ZQ calibration performed when an external ZQ calibration command of ZQCS is inputted is defined as tZQCS=64*tCK. A ZQ calibration period (tZQoper) for ZQ calibration performed when an external ZQ calibration command of ZQCL is inputted is defined as tZQoper=256*tCK.

When power is turned on, impedance adjustment can be performed for a long period of time. The ZQ calibration periods after the initial stage are short (64*tCK, 256*tCK). This is because the impedance adjusted by the intitial ZQ calibration is used for the subsequent ZQ calibrations and thereby the subsequent ZQ calibrations can be completed within a shorter period of time. Further, since the subsequent ZQ calibration periods are short, it is possible to shorten a period during which chip access is prohibited. It is assumed that the short-time ZQ calibrations (tZQCS, tZQoper) are performed at a certain frequency. When a short-time ZQ calibration is performed in a state in which device variation is small, specifically in cooperation with refresh cycles, it is possible to perform the ZQ calibration (tZQCS) without lowering the performance of the semiconductor device.

However, the impedance varies according to conditions under which the device is placed, such as an operation mode, a power source voltage, and temperature. That is, in a case where a self-refresh operation or the like is performed for a long period of time, even if a short-time ZQ calibration (tZQCS or tZQoper) is performed after the self-refresh operation, there is no guarantee that the impedance can be adjusted. As shown in FIG. 1, even if a DLL lock period (tDLLK=512*tCK) after completion of a self-refresh operation is employed for a ZQ calibration, there is no guarantee that the impedance can be adjusted. In accordance with the AC specifications, i.e., when a short-time ZQ calibration (tZQCS or tZQoper) is performed after a ZQ calibration command has been inputted, there is little possibility that the impedance can be adjusted.

A ZQ calibration operation is completed in a short period of time if the ZQ calibration result is close (or equal) to an output impedance at the time when a ZQ calibration command was inputted. If there is a difference between the impedance and the ZQ calibration result, then the ZQ calibration operation may not be completed within the defined ZQ calibration period. If the impedance matching is not completed successfully, the impedance of the transmission line does not match the output impedance of the semiconductor device. In this case, a data waveform is dulled during transmission so as to cause an overshoot or an undershoot, so that a high speed data transfer cannot be performed.

The following references relate to a ZQ calibration operation and a refresh operation of a semiconductor memory. Patent Document 1 (Japanese laid-open patent publication No. 2002-026712) discloses that a slew rate of an output circuit is adjusted by matching an external terminator. Patent Document 2 (Japanese laid-open patent publication No. 08-335871) discloses that a switching transistor is turned on and off by an external control signal so as to adjust the impedance. Patent Document 3 (Japanese laid-open patent publication No. 2005-065249) discloses that a terminating resistance of an input terminal and an impedance of an output circuit are adjusted by using one external resistance. Patent Document 4 (published Japanese translation No. 2005-506647) discloses that an input buffer is set in a disable state during an automatic refresh operation and in a low-power pre-charged state after the automatic refresh operation to thereby reduce a power of a semiconductor memory.

If there is a difference between a ZQ calibration result and an output impedance at the time when a ZQ calibration command was inputted, then the ZQ calibration operation may not be completed within the defined ZQ calibration period. In this case, the impedance of the transmission line does not match the output impedance of the semiconductor device. As a result, a data waveform is dulled during transmission so as to cause an overshoot or an undershoot, so that a high speed data transfer cannot be performed. The aforementioned references do not consider these problems and are silent on these problems.

SUMMARY OF THE INVENTION

The present invention has been made in view of the above drawbacks. A ZQ calibration operation is automatically added during operation of a semiconductor device so as to increase the number of impedance adjustments for more accurate impedance adjustment. Specifically, when a self-refresh operation is completed, a ZQ calibration command is generated to add a ZQ calibration operation for more accurate impedance adjustment. Thus, it is an object of the present invention to provide a ZQ calibration circuit capable of matching an impedance of a transmission line and an output impedance of a semiconductor device more accurately by automatically adding a ZQ calibration operation. Further, it is another object of the present invention to provide a semiconductor device which has such a ZQ calibration circuit and can perform a high speed data transfer.

In order to resolve the above problems, the present invention basically adopts the following technology. As a matter of course, the present invention covers applied technology in which various changes and modifications are made therein without departing from the spirit of the present invention.

According to a first aspect of the present invention, there is provided a ZQ calibration circuit capable of matching impedance of a transmission line and output impedance of a semiconductor device more accurately. A control signal for ZQ calibration is issued from a command different from an external ZQ calibration command so as to perform a ZQ calibration operation.

The control signal may be inputted into a counter so as to perform the ZQ calibration operation. In this case, the control signal may be inputted into the counter so as to perform a pull-up ZQ calibration operation. An additional control signal may be issued after completion of the pull-up ZQ calibration operation so as to perform a pull-down calibration operation. Further, the ZQ calibration operation performed by the control signal may be the same as a ZQ calibration operation performed when an external ZQ calibration command is inputted.

The command different from an external ZQ calibration command may be a command for a self-refresh operation. In this case, the ZQ calibration operation may be concurrently performed during a DLL lock period defined by the command for a self-refresh operation.

According to a second aspect of the present invention, there is provided a ZQ calibration circuit capable of matching an impedance of a transmission line and an output impedance of a semiconductor device more accurately. The ZQ calibration circuit includes a first pull-up circuit connected to a ZQ calibration terminal, a replica buffer having a second pull-up circuit and a pull-down circuit, and a first counter to which a first control signal and a second control signal are inputted. The ZQ calibration circuit also includes a second counter to which a third control signal and a fourth control signal are inputted, a first comparator operable to compare a potential of the ZQ calibration terminal with a reference potential, and a second comparator operable to compare a potential of a contact between the second pull-up circuit and the pull-down circuit with the reference potential. A first ZQ calibration operation is performed in response to the first control signal and the third control signal which are generated according to a ZQ calibration command. A second ZQ calibration operation is performed in response to the second control signal and the forth control signal which are generated according to a self-refresh command.

The first pull-up circuit, the first counter, and the first comparator may be configured to perform a pull-up ZQ calibration operation. The replica buffer, the second counter, and the second comparator may be configured to perform a pull-down ZQ calibration operation after the pull-up ZQ calibration operation.

According to a third aspect of the present invention, there is provided a semiconductor device which has the aforementioned ZQ calibration circuit and can perform a high speed data transfer.

According to a ZQ calibration circuit of the present invention, a ZQ calibration command is generated from a command different from an externally inputted ZQ calibration command so as to additionally perform a ZQ calibration operation. By additionally performing a ZQ calibration operation, the number of the ZQ calibration operations is increased so that the matching of the impedance can be conducted more accurately in a shorter period of time. The command different from the externally inputted ZQ calibration command is preferably a self-refresh command. In this case, it is possible to obtain a ZQ calibration circuit which automatically performs a ZQ calibration operation after a self-refresh operation. Further, it is possible to obtain a semiconductor device which has such a ZQ calibration circuit and can perform a high speed data transfer.

The above and other objects, features, and advantages of the present invention will be apparent from the following description when taken in conjunction with the accompanying drawings which illustrate preferred embodiments of the present invention by way of example.

DESCRIPTION OF THE PREFERRED EMBODIMENTS

Figure 1:
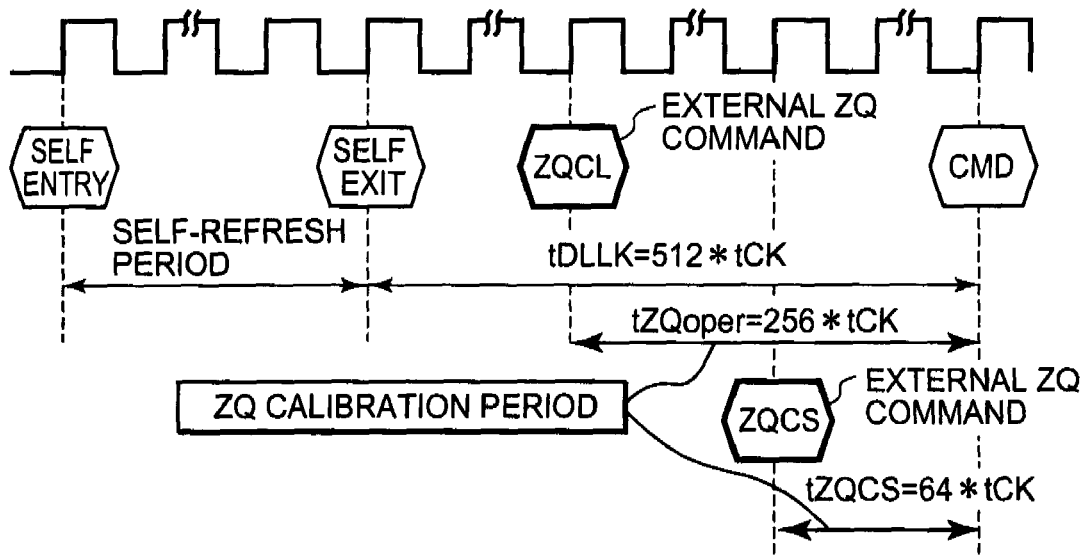
FIG. 1 is a timing chart of a conventional ZQ calibration operation.
Figure 2:
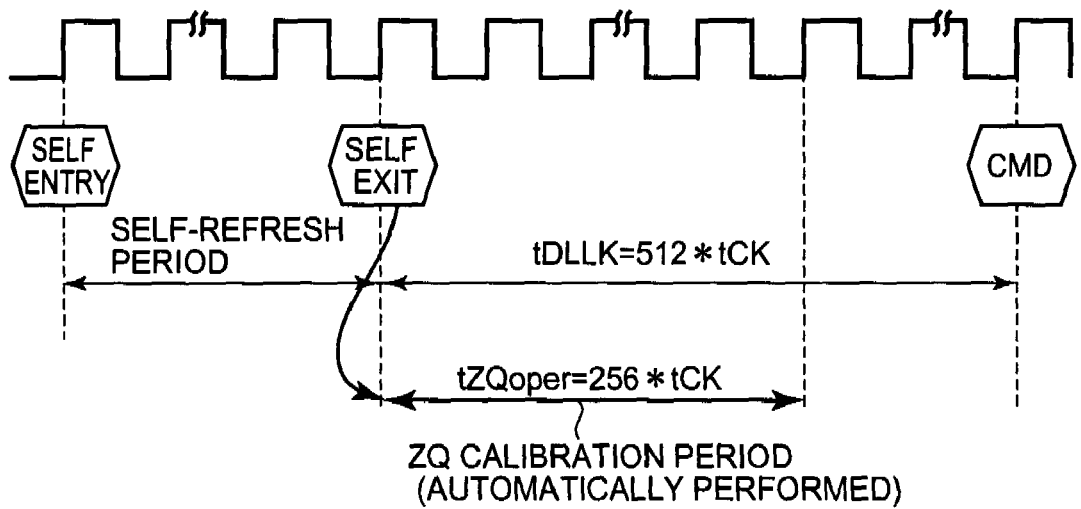
FIG. 2 is a timing chart of a ZQ calibration operation according to the present invention.
Figure 3:
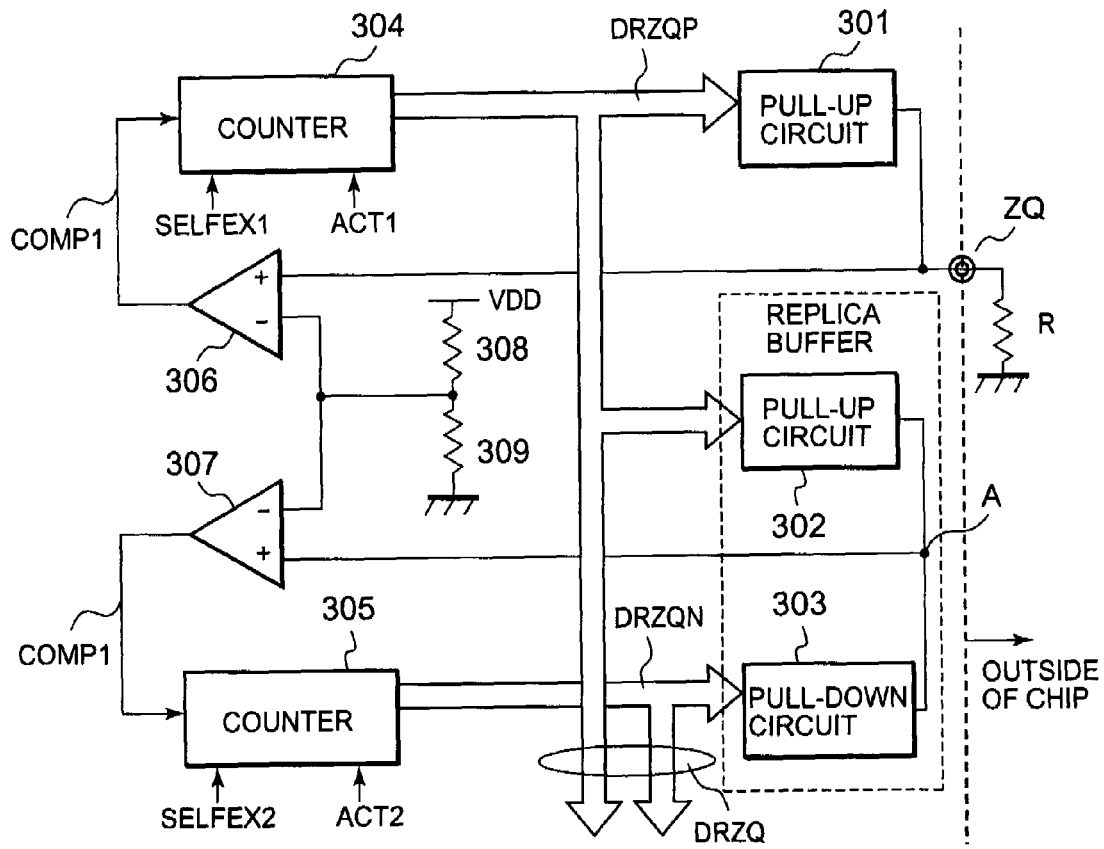
FIG. 3 is a circuit diagram of a ZQ calibration circuit according to the present invention.
Figure 4:
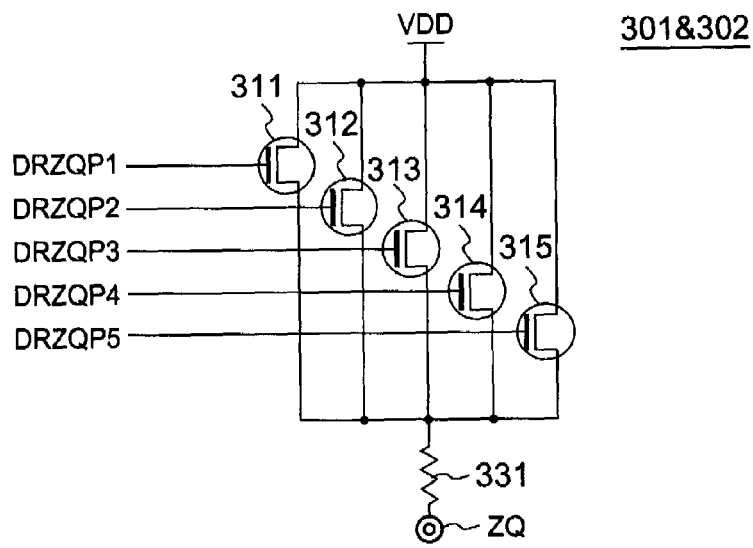
FIG. 4 is a circuit diagram of a pull-up circuit in the ZQ calibration circuit shown in FIG. 3.
Figure 5:
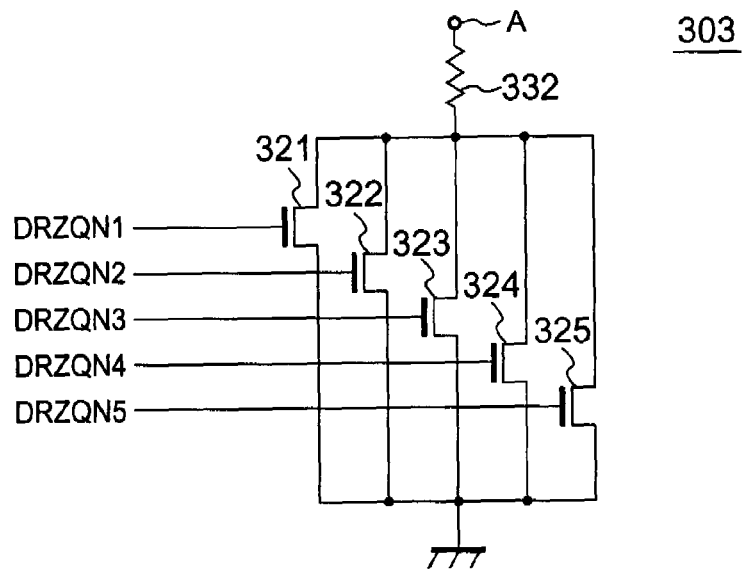
FIG. 5 is a circuit diagram of a pull-down circuit in the ZQ calibration circuit shown in FIG. 3.
Figure 6:
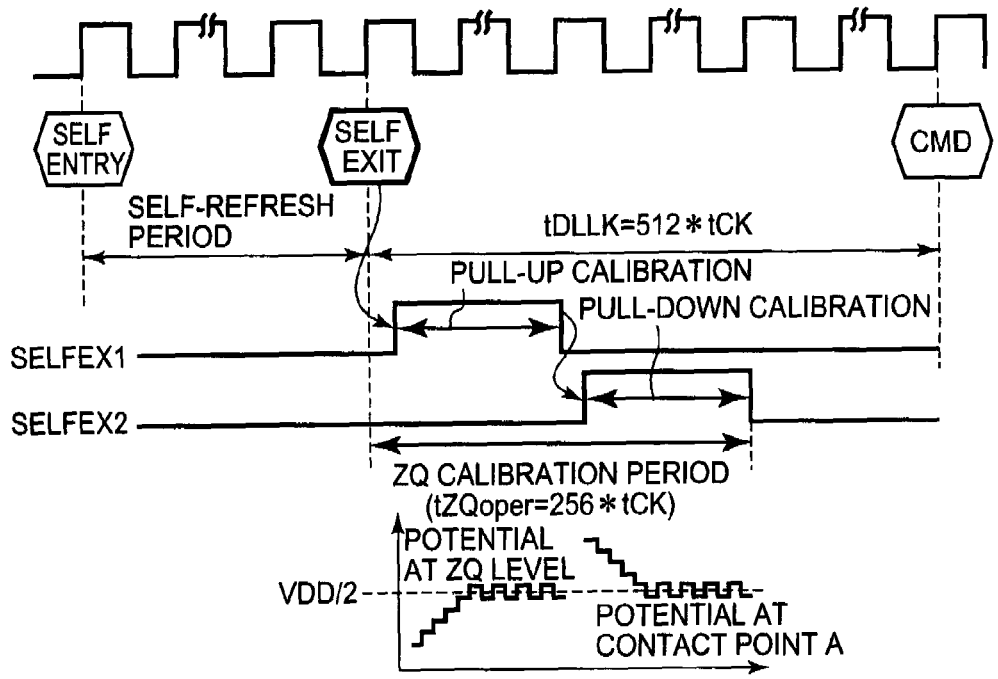
FIG. 6 is a timing chart of a ZQ calibration operation according to the present invention.

A preferred embodiment of the present invention will be described below with reference to FIGS. 2 through 6. FIG. 2 is a timing chart of a ZQ calibration operation according to the present invention. FIG. 3 is a circuit diagram of a ZQ calibration circuit, FIG. 4 is a circuit diagram of a pull-up circuit, and FIG. 5 is a circuit diagram of a pull-down circuit. FIG. 6 is a timing chart of a ZQ calibration operation. As shown in FIG. 2, the ZQ calibration circuit according to the present invention automatically performs a ZQ calibration operation after completion of a self-refresh operation. Even if no external ZQ calibration command is inputted, the ZQ calibration circuit automatically performs a ZQ calibration operation after completion of the self-refresh operation. Specifically, the ZQ calibration circuit concurrently performs a ZQ calibration operation (tDQoper=256*tCK) within a DLL clock cycle (tDLLK=512*tCK) after completion of the self-refresh operation.

The ZQ calibration circuit shown in FIG. 3 is incorporated in a semiconductor device. The ZQ calibration circuit includes a first pull-up circuit 301, a second pull-up circuit 302, a pull-down circuit 303, a first counter 304, a second counter 305, a first comparator 306, a second comparator 307, and resistances 308 and 309. Impedance control signals DRZQ from the ZQ calibration circuit are supplied to an output circuit. An impedance control signal DRZQP (DRZQP1 to DRZQP5) is outputted as a gate control signal for transistors forming a load at a final stage of the output circuit. An impedance control signal DRZQN (DRZQN1 to DRZQN5) is outputted as a gate control signal for transistors forming a driver at a final stage of the output circuit. The impedances of the load and the driver of the output circuit are set to optimal values.

The basic structure of the ZQ calibration circuit according to the present invention is the same as that of the inventors' prior Japanese patent application No. 2005-011272, the disclosure of which is incorporated herein by reference in its entirety. The ZQ calibration circuit according to the present invention differs from the prior Japanese patent application in that additional counter control signals SELFEX1 and SELFEX2 are inputted to the counters 304 and 305, respectively. The counter control signals SELFEX1 and SELFEX2 have the same functions as control signals ACT1 and ACT2, respectively. When the control signal SELFEX1 is inputted, the first counter 304 also starts a count operation for performing a ZQ calibration operation of the load. Similarly, when the control signal SELFEX2 is inputted, the second counter 305 also starts a count operation for performing a ZQ calibration operation of the driver. Other arrangements are the same as those of the prior Japanese patent application. Each of the first pull-up circuit 301, the second pull-up circuit 302, and the pull-down circuit 303 is formed by five impedance adjustment transistors connected in parallel. Each of the counters 304 and 305 has a 5-bit arrangement.

The semiconductor device has a pin ZQ for ZQ calibration. The pin ZQ is connected to a ground potential GND via an external resistance R. The first pull-up circuit 301 is provided between the pin ZQ for ZQ calibration and a power source potential VDD. Thus, the pin ZQ for ZQ calibration is connected to the power source potential VDD via the first pull-up circuit 301 and is connected to the ground potential GND via the external resistance R. The impedance of the pull-up circuit is made equal to the external resistance R by adjusting a potential of the pin ZQ for ZQ calibration so as to be a half of the power source potential VDD. The resistance 308 and the resistance 309 are connected in series between the power source potential VDD and the ground potential GND. The resistances 308 and 309 serve as a reference potential generation circuit for outputting a reference potential Vref from a contact between the two resistances 308 and 309. For example, the resistances 308 and 309 generate a potential of VDD/2 as a reference potential Vref.

The first comparator 306 is operable to compare an inputted potential of the pin ZQ for ZQ calibration with the reference potential Vref and generate an output COMP1. The first counter 304 starts a count operation in accordance with the output COMP1 of the first comparator 306 when the control signal ACT1 or the control signal SELFEX1 is activated. The transistors in the pull-up circuits are brought into conduction or out of conduction by the impedance control signal DRZQP (DRZQP1 to DRZQP5) outputted from the first counter 304, thereby adjusting the impedance.

The first counter 304 is initially set so that all bits have a high level (11111). When the control signal ACT1 or the control signal SELFEX1 is activated, the first counter 304 performs a count-down operation if the output COMP1 has a low level and performs a count-up operation if the output COMP1 has a high level. The first counter 304 outputs a 5-bit signal DRZQP (DRZQP1 to DRZQP5). Each of the pull-up circuits 301 and 302 is supplied with the impedance control signals DRZQP1 to DRZQP5, which bring the corresponding transistors into conduction or out of conduction so as to adjust the impedance. Further, the impedance control signals DRZQP1 to DRZQP5 are outputted as control signals for transistors forming a load at the final stage of the output circuit.

Further, the second pull-up circuit 302 is provided between the power source potential VDD and a contact A. The pull-down circuit 303 is provided between the contact A and the ground potential GND. Thus, the second pull-up circuit 302 and the pull-down circuit 303 form a replica buffer. A potential of the contact A and the reference potential Vref are inputted into the second comparator 307, which compares these potentials with each other to generate an output COMP2. The second counter 305 starts a count operation when the control signal ACT2 or the control signal SELFEX2 is activated. For example, the second counter 305 is initially set so that all bits have a low level (00000). The second counter 305 performs a count-down operation if the output COMP2 has a low level and performs a count-up operation if the output COMP2 has a high level.

The second counter 305 outputs a 5-bit impedance control signal DRZQN (DRZQIN1 to DRZQIN5). The pull-down circuit 303 is supplied with the impedance control signals DRZQN1 to DRZQN5, which bring the corresponding transistors into conduction or out of conduction so as to adjust the impedance. Further, the impedance control signals DRZQN1 to DRZQN5 are outputted as control signals for transistors forming a driver at the final stage of the output circuit.

The pull-up circuits 301 and 302 will be described in detail with reference to FIG. 4. Since the first pull-up circuit 301 and the second pull-up circuit 302 have the same structure, the following description concerns only the first pull-up circuit 301. FIG. 4 is a circuit diagram of the pull-up circuit 301 (or 302). As shown in FIG. 4, the pull-up circuit 301 includes a plurality of P-channel transistors 311 to 315 (five transistors in FIG. 4) and a resistance 331. Sources of the P-channel transistors 311 to 315 are jointly connected to the power source potential VDD, and drains of the P-channel transistors 311 to 315 are jointly connected to a first end of the resistance 331. Further, a second end of the resistance 331 is connected to the pin ZQ for ZQ calibration. The impedance control signals DRZQP1 to DRZQP5 are inputted into corresponding gates of the P-channel transistors 311 to 315. The impedance control signals DRZQP1 to DRZQP5 have a binary bit arrangement. The size of the corresponding transistors is based on the binary system.

For example, assuming that the transistor 311 has a size of W/L, the transistor 312 has a size of 2 W/L. The transistor 313 has a size of 4 W/L, the transistor 314 a size of 8 W/L, and the transistor 315 a size of 16 W/L. Thus, the transistors have a size of $2^{(n-1)}$ W/L. Each of the transistors is set to have an impedance ratio of $2^{(n-1)}$. The second end of the resistance 331 is connected to the pin ZQ for ZQ calibration. The pull-up circuit 301 serves to pull up a potential of the pin ZQ for ZQ calibration toward the power source potential.

The pull-up circuits 301 and 302 have the same arrangement as the load at the final stage of the output circuit. Thus, the pull-up circuits 301 and 302 are replica circuits for the load at the final stage of the output circuit. Further, the pull-down circuit 303, which will be described later, has the same arrangement as the driver at the final stage of the output circuit. Thus, the pull-down circuit 303 is a replica circuit for the driver at the final stage of the output circuit. Accordingly, each of the pull-up circuits 301, 302, and the pull-down circuit 303 is simply referred to as a replica circuit. The buffer formed by the second pull-up circuit 302 and the pull-down circuit 303 is referred to as a replica buffer of the output circuit. Here, it is desirable that each of the pull-up circuits 301, 302, and the pull-down circuit 303 is a replica circuit for the output circuit and has the same arrangement as the output circuit. However, each of the pull-up circuits 301, 302, and the pull-down circuit 303 may not have strictly the same arrangement and may have substantially the same arrangement as the output circuit. The size of the pull-up circuits 301, 302, and the pull-down circuit 303 may be shrunken as long as the pull-up circuits 301, 302, and the pull-down circuit 303 have volt-ampere characteristics equivalent to those of the output circuit.

The pull-down circuit 303 will be described in detail with reference to FIG. 5. FIG. 5 is a circuit diagram of the pull-down circuit 303. As shown in FIG. 5, the pull-down circuit 303 includes a plurality of N-channel transistors 321 to 325 (five transistors in FIG. 5) and a resistance 332. Sources of the N-channel transistors 321 to 325 are jointly connected to the ground potential GND, and drains of the N-channel transistors 321 to 325 are jointly connected to a first end of the resistance 332. Further, a second end of the resistance 332 is connected to the contact A. The impedance control signals DRZQN1 to DRZQN5 are inputted into corresponding gates of the N-channel transistors 321 to 325. The impedance control signals DRZQN1 to DRZQN5 have a binary bit arrangement. Thus, the size of the corresponding transistors is based on the binary system.

For example, assuming that the transistor 321 has a size of W/L, the transistor 322 has a size of 2 W/L. The transistor 323 has a size of 4 W/L, the transistor 324 a size of 8 W/L, and the transistor 325 a size of 16 W/L. Thus, the transistors have a size of $2^{(n-1)}$ W/L. Each of the transistors is set to have an impedance ratio of $2^{(n-1)}$. The second end of the resistance 332 is connected to the contact A. The pull-down circuit 303 serves to pull down a potential of the contact A toward the ground potential.

The ZQ calibration operation according to the present invention will be described below. The calibration operation is an operation to generate a control signal for optimizing the impedance of the replica circuit of the output circuit. The impedance of the output circuit is adjusted by the optimized control signal. When power is turned on, an initial ZQ calibration operation (ZQinit) is performed for setting the output circuit. Further, in order to set the output circuit more accurately, ZQ calibration operations (ZQCS, ZQoper) are periodically performed during an actual operation of the semiconductor device. Furthermore, according to the present invention, an additional calibration operation is also performed after completion of a self-refresh operation.

As shown in FIG. 3, a ZQ calibration operation is performed in a state in which the external resistance R is externally attached to the pin ZQ for ZQ calibration. The external resistance R should have a resistance value that meets requirements for the output circuit. In the ZQ calibration operation, the impedance control signals DRZQP1 to DRZQP5 are determined so that the external resistance R and the impedance of the pull-up circuits 301 and 302 are equal to each other. Further, the impedance control signals DRZQN1 to DRZQN5 are determined so that the impedance of the second pull-up circuit 302 and the impedance of the pull-up circuit 303 are equal to each other. The impedance control signals DRZQP1 to DRZQP5 and the impedance control signals DRZQN1 to DRZQN5 thus obtained are used as gate control signals for the transistors of the output circuit to thereby adjust the impedance of the output circuit to an optimal value.

First, the control signal ACT1 (or the control signal SELFEX1) is activated so as to perform impedance adjustment of the pull-up circuit connected to the pin ZQ for ZQ calibration. The impedance of the first pull-up circuit 301 is adjusted so as to be equal to the external resistance R connected to the pin ZQ for ZQ calibration. After the adjustment is completed, the impedance control signals at that time are fixed and supplied to the pull-up circuits 301 and 302 and to the gates of the transistors forming the load at the final stage of the output circuit. Then, the control signal ACT2 (or the control signal SELFEX2) is activated so as to perform impedance adjustment of the pull-down circuit connected to the contact A.

The ZQ calibration operation is started when ZQ calibration is commanded by an external command or when a self-refresh command (SELFEXIT in the present embodiment) is inputted. Then, the control signal ACT1 (or the control signal SELFEX1) is activated to start a count operation of the first counter 304. At that time, the control signal ACT2 and the control signal SELFEX2 are in an inactive state. It is assumed that the first counter 304 is initially set so that all impedance control signals DRZQP1 to DRZQP5 have a high level (11111) while all transistors of the first pull-up circuit 301 are in an off-state, Because the potential of the pin ZQ for ZQ calibration is a ground potential GND and is lower than the reference potential Vref, the first comparator 306 generates an output COMP1 having a low level. The first counter 304 performs a count-down operation so as to output an impedance control signal DRZQP of (11110).

The impedance control signal DRZQP of (11110) brings the transistor 311 of the pull-up circuits 301 and 302 into an on-state and the transistors 312, 313, 314, and 315 of the pull-up circuits 301 and 302 into an off-state. The transistor 311 has a minimum size of W/L and a low drive capability. Accordingly, the potential of the pin ZQ for ZQ calibration becomes slightly higher than the ground potential GND but is still lower than the reference potential Vref. Accordingly, the output COMP1 of the first comparator 306 still has a low level. Thus, the first counter 304 further performs a count-down operation so as to output an impedance control signal DRZQP of (11101).

When the impedance control signal DRZQP of (11101) is inputted into the pull-up circuits 301 and 302, the impedance control signal DRZQP brings the transistor 312 into an on-state and the transistors 311, 313, 314, and 315 into an off-state. The transistor 312 has a size of 2 W/L. Accordingly, the potential of the pin ZQ for ZQ calibration becomes higher than that in a case of the impedance control signal DRZQP of (11110). However, the potential of the pin ZQ for ZQ calibration is still lower than the reference potential Vref. Accordingly, the output COMP1 of the first comparator 306 still has a low level. Thus, the first counter 304 further performs a count-down operation so as to output an impedance control signal DRZQP of (11100).

These steps are sequentially repeated so that the first counter 304 performs a count-down operation to bring the transistors having a larger size in the first pull-up circuit 301 into an on-state. As the count operation is repeated, the impedance of the first pull-up circuit 301 is gradually lowered while the potential of the pin ZQ for ZQ calibration is gradually increased. When the potential of the pin ZQ for ZQ calibration becomes higher than the reference potential Vref by repetition of the count operation, the output COMP1 of the first comparator 306 becomes a high level. Then, the first counter 304 inversely performs a count-up operation. Thus, the output of the comparator 306 becomes a low level or a high level according to the magnitude of the potential of the pin ZQ for ZQ calibration and the reference potential Vref, so that the first counter 304 accordingly performs a count-down operation or a count-up operation. As a result, the potential of the pin ZQ for ZQ calibration is stabilized near the reference potential Vref (=VDD/2).

When the potential of the pin ZQ for ZQ calibration is stabilized near the reference potential Vref (=VDD/2), the control signal ACT1 (or the control signal SELFEX1) is inactivated. The inactivation of the control signal ACT1 (or the control signal SELFEX1) stops the count operation of the first counter 304 and fixes the count value. Further, the impedance adjustment of the pull-up circuits is completed and fixed by the fact that levels of the impedance control signals DRZQP1 to DRZQP5 are fixed. At that time, the impedance of the pull-up circuits 301 and 302 is fixed so as to be equal to the external resistance R. While the pull-up circuits are thus fixed, the control signal ACT2 (or the control signal SELFEX2) is activated to perform impedance adjustment of the pull-down circuit.

When the ZQ calibration operation of the first pull-up circuit 301 is completed, the control signal ACT2 (or the control signal SELFEX2) is activated so as to start a count operation of the second counter 305. It is assumed that the second counter 305 is initially set so that all impedance control signals DRZQN1 to DRZQN5 have a low level (00000) while all transistors of the pull-down circuit 303 are in an off-state. Because the potential of the contact A is a power source potential VDD, the second comparator 307 generates an output COMP2 having a high level. The second counter 305 performs a count-up operation so as to output an impedance control signal DRZQN of (00001).

The impedance control signal DRZQN of (00001) from the second counter 305 brings the transistor 321 of the pull-down circuit 303 into an on-state and the transistors 322, 323, 324, and 325 of the pull-down circuit 303 into an off-state. The transistor 321 has a minimum size of W/L and a low drive capability. Accordingly, the potential of the contact A becomes slightly lower than the power source potential VDD but is still higher than the reference potential Vref. Accordingly, the output COMP2 of the second comparator 307 still has a high level. Thus, the second counter 305 further performs a count-up operation so as to output an impedance control signal DRZQN of (00010).

When the impedance control signal DRZQN of (00010) is inputted into the pull-down circuit 303, the impedance control signal DRZQN brings the transistor 322 into an on-state and the transistors 321, 323, 324, and 325 into an off-state. The transistor 322 has a size of 2 W/L. Accordingly, the potential of the contact A becomes lower than that in a case of the bit signal DRZQN of (00001). However, the potential of the contact A is still higher than the reference potential Vref. Accordingly, the output COMP2 of the second comparator 307 still has a high level. Thus, the second counter 305 further performs a count-up operation so as to output an impedance control signal DRZQN of (00011).

These steps are sequentially repeated so that the second counter 305 performs a count-up operation to bring the transistors having a larger size in the pull-down circuit 303 into an on-state. As the count operation is repeated, the impedance of the pull-down circuit 303 is gradually lowered while the potential of the contact A is gradually lowered. When the potential of the contact A becomes lower than the reference potential Vref by repetition of the count operation, the output COMP2 of the second comparator 307 becomes a low level. Then, the second counter 305 inversely performs a count-down operation. Thus, the output of the comparator 307 becomes a high level or a low level according to the magnitude of the potential of the contact A and the reference potential Vref, so that the second counter 305 accordingly performs a count-up operation or a count-down operation. As a result, the potential of the contact A is stabilized near the reference potential Vref (=VDD/2).

When the potential of the contact A is stabilized near the reference potential Vref (=VDD/2), the control signal ACT2 (or the control signal SELFEX2) is inactivated. The inactivation of the control signal ACT2 (or the control signal SELFEX2) stops the count operation of the second counter 305 and fixes the count value. Further, the impedance adjustment of the pull-down circuit is completed by the fact that levels of the impedance control signals DRZQN1 to DRZQN5 are fixed. Thus, when the control signal ACT2 (or the control signal SELFEX2) is inactivated, all of states are fixed.

The impedance of the pull-up circuits 301 and 302 is fixed so as to be equal to the external resistance R when the control signal ACT1 (or the control signal SELFEX1) is activated. Further, the impedance of the pull-down circuit 303 is fixed so as to be equal to the impedance of the second pull-up circuit 302 when the control signal ACT2 (or the control signal SELFEX2) is activated. As a result, all of the pull-up circuits 301, 302, and the pull-down circuit 303 are set to have an impedance equal to the external resistance R. The impedance of the output circuit is adjusted by using the impedance control signals DRZQP and DRZQN as control signals of the output circuit. Thus, it is possible to obtain a semiconductor device which includes an output circuit having matched impedance and can perform a high speed data transfer.

As described above, a pull-up ZQ calibration operation is started not only by the control signal ACT1 but also by the control signal SELFEX1. Further, a pull-down ZQ calibration operation is also performed by the control signal SELFEX2. Thus, the ZQ calibration circuit according to the present invention can perform a ZQ calibration operation by the control signals SELFEX1 and SELFEX2, which are different from the control signals ACT1 and ACT2. The control signal SELFEX1 is automatically issued from an internal circuit after a self-refresh command SELFEXIT has been issued. Further, the control signal SELFEX2 is automatically issued so as to perform a pull-down ZQ calibration operation when a pull-up ZQ calibration operation is completed. Thus, the ZQ calibration operation is automatically added after the self-refresh operation.

Operation of a ZQ calibration circuit according to the present invention will be described below with reference to FIG. 6. FIG. 6 is a timing chart of a ZQ calibration operation according to the present invention. Usually, when an external ZQ calibration command is issued, the control signal ACT1 is activated so as to start a ZQ calibration operation. According to the present invention, the control signal SELFEX1 is further inputted as a signal for performing the same control process as the control signal ACT1. An external command SELFENTRY for self-refresh is inputted to start a self-refresh operation. The self-refresh period is ended by an external command SELFEXIT.

When the external command SELFEXIT is issued, the control signal SELFEXI is activated (with a high level in the example shown in FIG. 6) so as to start a pull-up ZQ calibration operation. The pull-up ZQ calibration operation is performed as described above. Thus, the pull-up ZQ calibration is first performed by the control signal SELFEX1. The level of the pin ZQ for ZQ calibration is gradually increased by the counter operation of the first counter 304 and stabilized near a level of VDD/2. Then, the control signal SELFEX1 is inactivated (with a low level in the example shown in FIG. 6) so as to fix the impedance control signal DRZQP.

When the control signal SELFEX1 is inactivated, the control signal SELFEX2 is activated (with a high level in the example shown in FIG. 6) so as to start a pull-down ZQ calibration operation. The pull-down ZQ calibration operation is performed as described above. The level of the contact A is gradually lowered by the counter operation of the second counter 305 and stabilized near a level of VDD/2. Then, the control signal SELFEX2 is inactivated (with a low level in the example shown in FIG. 6) so as to fix the impedance control signal DRZQN. Thus, the ZQ calibration operation is completed.

According to the present invention, the ZQ calibration operation is automatically started by the external command SELFEXIT for a self-refresh operation. After the completion of the pull-up ZQ calibration, the pull-down ZQ calibration is automatically started. No external commands are inputted during a DLL lock period (TDLLK=512*tCK) of 512 clocks after the self-refresh operation. The ZQ calibration operation is concurrently performed with use of the DLL lock period. Accordingly, the ZQ calibration operation has no influence on an external access prohibition period. Further, commands can be inputted after completion of the DLL lock period (tDLLK=512*tCK). The ZQ calibration can be completed until the completion of the DLL lock period. Accordingly, in a case where a ZQ calibration command is inputted during the calibration operation, even if the calibration operation is performed while the ZQ calibration command is ignored, the specifications (tZQoper=256*TCK, tZQCS=64*tCK) can be met. Thus, the ZQ calibration operation according to the present invention is consistent with the conventional specifications.

As described above, the ZQ calibration operation is automatically performed after the completion of the self-refresh operation, The DLL lock period has 512 cycles, which are sufficient for a ZQ calibration period. Accordingly, the ZQ calibration operation can be performed accurately. Further, an additional ZQ calibration operation is performed in addition to a ZQ calibration operation performed by an external ZQ calibration command. Therefore, the number of the ZQ calibration operations is increased. Intervals of the ZQ calibration operations can be made shorter so as to perform the ZQ calibration operations more accurately. Thus, it is possible to obtain a ZQ calibration circuit which automatically performs a ZQ calibration operation after a self-refresh operation. Further, it is possible to obtain a semiconductor device which has such a ZQ calibration circuit and can perform a high speed data transfer.

While the present invention has been described in detail with reference to the preferred embodiment thereof, it would be apparent to those skilled in the art that many modifications and variations may be made therein without departing from the spirit and scope of the present invention. As a matter of course, the present invention covers such modifications and variations.

For example, in the above embodiment, the ZQ calibration operation is automatically performed with use of a self-refresh command. However, a ZQ command may be issued from a self-refresh command by an internal operation and used to perform a ZQ calibration operation. Further, such a command is not limited to a self-refresh command. The present invention is applicable to a case in which an operation period specified by an external command is long and has a large number of clocks until a next command is inputted.

What is claimed is:

1. A ZQ calibration circuit comprising:
a ZQ calibration terminal; and
a control circuit coupled to the ZQ calibration terminal to perform a ZQ calibration operation in response to a control signal,
wherein the control signal is issued by an external ZQ calibration command and further by a different external command from the external ZQ calibration command, and each of the different external command and the ZQ calibration command is supplied without an intervention of the ZQ calibration terminal.

2. The ZQ calibration circuit as recited in claim 1, wherein the different external command is an external command for starting a self-refresh operation.

3. The ZQ calibration circuit as recited in claim 2, wherein the control signal is issued by the external command for starting the self-refresh operation, and the ZQ calibration operation starts at an end of the self-refresh operation.

4. The ZQ calibration circuit as recited in claim 3, wherein the ZQ calibration operation is performed during a DLL lock period after the self-refresh operation.

5. The semiconductor device as recited in claim 1, wherein the command different from the external ZQ calibration command is an external command for starting a self-refresh operation of the semiconductor device.

6. The semiconductor device as recited in claim 5, wherein the control signal is issued by the external command for starting the self-refresh operation, and the ZQ calibration operation starts at an end of the self-refresh operation.

7. The semiconductor device as recited in claim 6, wherein the ZQ calibration operation is performed during a DLL lock period after the self-refresh operation.

8. A ZQ calibration circuit comprising:
a first pull-up circuit connected to a ZQ calibration terminal;
a replica buffer having a second pull-up circuit and a pull-down circuit;
a first counter to which a first control signal and a second control signal are inputted; a second counter to which a third control signal and a fourth control signal are inputted;
a first comparator connected to said first counter and operable to compare a potential of the
ZQ calibration terminal with a reference potential; and
a second comparator connected to said second counter and operable to compare a potential of a contact between said second pull-up circuit and said pull-down circuit with the reference potential;
wherein a first ZQ calibration operation is performed in response to the first control signal and the third control signal which are generated according to a ZQ calibration command, and
wherein a second ZQ calibration operation is performed in response to the second control signal and the fourth control signal which are generated according to a self-refresh command.

9. The ZQ calibration circuit as recited in claim 8, wherein said first pull-up circuit, said first counter, and said first comparator are configured to perform a pull-up ZQ calibration operation, wherein said replica buffer, said second counter, and said second comparator are configured to perform a pull-down ZQ calibration operation after the pull-up ZQ calibration operation.

10. A semiconductor device comprising a ZQ calibration circuit including:

a first pull-up circuit connected to a ZQ calibration terminal;

a replica buffer having a second pull-up circuit and a pull-down circuit;

a first counter to which a first control signal and a second control signal are inputted;

a second counter to which a third control signal and a fourth control signal are inputted; a first comparator connected to said first counter and operable to compare a potential of the ZQ calibration terminal with a reference potential; and a second comparator connected to said second counter and operable to compare a potential of a contact between said second pull-up circuit and said pull-down circuit with the reference potential;

wherein a first ZQ calibration operation is performed in response to the first control signal and the third control signal which are generated according to a ZQ calibration command, and wherein a second ZQ calibration operation is performed in response to the second control signal and the fourth control signal which are generated according to a self-refresh command.

* * * * *

UNITED STATES PATENT AND TRADEMARK OFFICE
CERTIFICATE OF CORRECTION

PATENT NO. : 7,839,159 B2
APPLICATION NO. : 11/585108
DATED : November 23, 2010
INVENTOR(S) : Masayuki Nakamura and Hideyuki Yoko It is certified that error appears in the above-identified patent and that said Letters Patent is hereby corrected as shown below:

Column 1, Line 8 in the Abstract: Delete "self-refreshed" and insert -- self-refresh --

Column 1, Line 52: Before "tZQinit" delete "ti"

Column 2, Line 7: Delete "intitial" and insert -- initial --

Column 5, Line 22: Delete "inventors'prior" and insert -- inventors' prior --

Column 6, Line 64: Delete "$2^{(n-1)}$," and insert -- $2^{(n-1)}$. --

Column 8, Line 33: Delete "off-state," and insert -- off-state. --

Column 11, Line 28: Delete "(TDLLK" and insert -- (tDLLK --

Column 11, Line 39: Delete "TCK," and insert -- tCK, --

Column 11, Line 45: Delete "operation," and insert -- operation. --

Signed and Sealed this
Sixteenth Day of October, 2012

David J. Kappos
*Director of the United States Patent and Trademark Office*